United States Patent
Hsieh et al.

(10) Patent No.: US 7,615,442 B2
(45) Date of Patent: Nov. 10, 2009

(54) METHOD FOR FABRICATING TRENCH METAL-OXIDE-SEMICONDUCTOR FIELD EFFECT TRANSISTOR

(75) Inventors: Hsin-Huang Hsieh, Hsinchu (TW); Mao-Song Tseng, Hsinchu (TW); Chien-Ping Chang, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 511 days.

(21) Appl. No.: 11/606,100

(22) Filed: Nov. 30, 2006

(65) Prior Publication Data

US 2007/0134882 A1 Jun. 14, 2007

(30) Foreign Application Priority Data

Dec. 9, 2005 (TW) ............................. 94143711 A

(51) Int. Cl.
*H01L 21/8242* (2006.01)
(52) U.S. Cl. ................ 438/242; 438/197; 257/E27.099
(58) Field of Classification Search ................ 438/197, 438/361, 242; 257/E21.435, E27.099, E29.13
See application file for complete search history.

(56) References Cited

U.S. PATENT DOCUMENTS

| 7,135,738 B2 * | 11/2006 | Williams et al. ............. 257/328 |
| 2004/0259318 A1 * | 12/2004 | Williams et al. ............. 438/400 |

* cited by examiner

*Primary Examiner*—Thao P. Le
(74) *Attorney, Agent, or Firm*—Bacon & Thomas, PLLC

(57) ABSTRACT

A method for fabricating a trench metal-oxide-semiconductor field effect transistor is disclosed. The method comprises steps of providing a substrate with an epitaxy layer thereon and etching the epitaxy layer to form a trench structure; forming a gate oxide layer on the surface of the epitaxy layer and the inner sidewalls of the trench structure and depositing a polysilicon layer to fill the trench structure; introducing a nitrogen gas and performing a driving-in procedure to form a body structure; performing an implantation procedure to form a source layer; forming a dielectric layer on the trench structure and the source layer; etching the dielectric layer and the source layer to define a source structure and form a contact region; filling the contact region with a contact structure layer; and forming a conductive metal layer on the contact structure layer and the dielectric layer.

20 Claims, 8 Drawing Sheets

METHOD FOR FABRICATING TRENCH METAL-OXIDE-SEMICONDUCTOR FIELD EFFECT TRANSISTOR

FIELD OF THE INVENTION

The present invention relates to a method for fabricating a metal-oxide-semiconductor field effect transistor (MOSFET), and more particularly for fabricating a trench metal-oxide-semiconductor field effect transistor (TMOSFET).

BACKGROUND OF THE INVENTION

The metal-oxide-semiconductor field effect transistor (TMOSFET) is one of the control switches with low power requirement, high switch speed, and small volume; hence it is widely used in the analog or digital circuit design of the computers and communication apparatus for operating, treating or memorizing lots of data.

Please refer to FIGS. 1(a)-(g), which are schematic diagrams showing the conventional process for fabricating the TMOSFET. The process comprises the following steps of: (a) providing a substrate 11 and forming an epitaxy layer 12 and an oxide layer 13 thereon (as shown in FIG. 1(a)); (b) defining the oxide layer 13 and the epitaxy layer 12 with a photolithographic process and an etching procedure to form a trench structure 14 (as shown in Fig. (b)); (c) removing the oxide layer 13 by an etching procedure and forming a gate oxide layer 15 on the surface of the epitaxy layer 12 and the inner sidewalls of the trench structure 14 and then filling the trench structure 14 with the polysilicon layer 16 (as shown in FIG. 1(c)); (d) etching partial of the polysilicon layer 16 and the gate oxide layer 15 until the gate oxide layer 15 having a thickness of about 200 Å is left on the surface of the epitaxy layer 12 (as shown in FIG. 1(d)); and (e) performing a body implantation and a body drive-in procedure to form a body structure 121 in the epitaxy layer 12 (as shown in FIG. 1(e)).

The conventional body drive-in procedure is performed under a high temperature to diffuse the impurities to the deeper area of the epitaxy layer 12 for meeting the requirement of the electricity, by means of that ions naturally diffuse from high concentration area to low concentration area. Generally, the body drive-in procedure in step (e) is performed in the furnance with oxygen gas. Under the circumstances with oxygen and high temperature, the surface of the epitaxy layer 12 without the cover of the polysilicon layer 16 after the etching procedure in step (c) is easily being oxidized, which results in the formation of the silicon oxide 122 as shown in FIG. 1(e). Therefore the silicon oxide 122 on the surface of the body structure 121 has to be etched back to a thickness about 200 Å in step (f) (as shown in FIG. 1(f)). Then the source implantation and the source drive-in procedure are performed on the body structure 121 in step (g) for forming a source structure 123 as shown in FIG. 1(g). Finally, after the following procedures for depositing the dielectric layer and forming the conductive metal layer are performed, the basic structure of the TMOSFET is accomplished.

As described above, the drive-in procedure for forming the body structure 121 is performed under a high temperature with oxygen gas and thus the silicon oxide 122 is easily formed on the surface of the body structure 121. For avoiding the affection of the silicon oxide 122 to the quality of the source implantation in step (g), the silicon oxide 122 has to be etched back to a thickness about 200 Å before the source implantation and the source drive-in procedure are performed. However, the etch back step is an additional step in the TMOSFET fabricating procedure, which may also cause the silicon loss at the trench top corner 124 as shown in FIG. 1(e) and FIG. 1(f).

In addition, please refer to FIG. 1(f) again; the trench top corner profile of the trench top corner 124 on the body structure 121 is changed with the formation of the slanting sharp corner 1241 after the silicon oxide 122 is etched back. The slanting sharp corner 1241 may cause the abnormal electric leakage and the damage of the profile of the silicon MESA (Si MESA) 125 of the TMOSFET. Besides, the source structure 123 is usually formed by an isotropic implantation and a source driving-in procedure in step (g), therefore the formation of the slanting sharp corner 1241 at the trench top corner 124 in step (f) may also affect the source junction profile and the source junction depth of the source structure 123 indirectly. The slanting sharp corner 1231 of the source structure 123 will be formed if the source structure 123 has a large source junction depth (as shown in FIG. 1(g)). Moreover, the slanting sharp corner 1231 may cause the reduction of the channel 126 of the body structure 121, the drop of the voltage threshold (Vt), the increase of the Idss, and even the punching through of the TMOSFET.

Please refer to FIG. 2, which is the scanning electron microscope (SEM) image of the TMOSFET fabricated by the conventional process. As shown in FIG. 2, the silicon oxide 122 formed on the surface of the body structure 121 in the body drive-in procedure under a high temperature with oxygen gas is etched back, and the profile of the trench top corner 124 is changed with the formation of the slanting sharp corner 1241 (pointed by the arrow), which may also cause the change of the profile of the source structure in the follow-up source implantation and drive-in procedure indirectly. In addition, the conventional TMOSFET shows 0% of yield, 0V of voltage threshold, and the maximal Idss by the wafer accept test (WAT).

Therefore, it is required to develop a method for fabricating the TMOSFET to simplify the fabricating procedure and avoid the silicon loss at the trench top corner.

SUMMARY OF THE INVENTION

An object of the present invention is to provide a method for fabricating the trench metal-oxide-semiconductor field effect transistor (TMOSFET). The oxygen gas used in the conventional fabricating method for performing the body drive-in procedure is replaced by the nitrogen gas to prevent the body structure driven in the epitaxy layer from being oxidized. Therefore the formation of the silicon oxide on the surface of the body structure can be avoided and the change of the profile of the trench top corner can be averted. Of course, the reduction of the channel, the drop of the voltage threshold, the increase of the Idss, and the punching through of the TMOSFET can also be avoided.

In accordance with an aspect of the present invention, the method for fabricating a TMOSFET is provided. The method for fabricating a TMOSFET includes steps of: (a) providing a substrate, forming an epitaxy layer on the substrate and etching the epitaxy layer to form a trench structure; (b) forming a gate oxide layer on the surface of the epitaxy layer and the inner sidewalls of the trench structure and depositing a polysilicon layer to fill the trench structure; (c) introducing a nitrogen gas and performing a driving-in procedure to form a body structure in the epitaxy layer; (d) performing an implantation procedure to form a source layer between the body structure and the gate oxide layer; (e) forming a dielectric layer on the trench structure and the source layer; (f) etching the dielectric layer and the source layer downwardly to the surface of the body structure to define a source structure and form a contact region; (g) filling the contact region with a contact structure layer; and (h) forming a conductive metal layer on the contact structure layer and the dielectric layer to form the trench metal-oxide-semiconductor field effect transistor.

In an embodiment, the epitaxy layer is an N-typed epitaxy layer or a P-typed epitaxy layer.

In an embodiment, the step (a) further comprises steps of: (a1) forming a mask oxide layer on the epitaxy layer; (a2) defining a trench opening to expose the surface of the epitaxy layer for forming the trench structure; and (a3) etching the epitaxy layer to form the trench structure and removing the mask oxide layer.

In an embodiment, the mask oxide layer in the step (a1) is a tetra ethyl ortho silicate (TEOS) layer with a thickness substantially ranged from 0.3 to 1 μm and formed by a tetra ethyl ortho silicate chemical vapor disposition (TEOS-CVD) process, and the trench opening in the step (a2) is defined by a photolithographic process.

In an embodiment, the gate oxide layer is formed by a thermal oxidation procedure, and the step (b) further comprises a step (b1) of removing partial of the gate oxide layer and the polysilicon layer from the surface of the epitaxy layer and controlling a difference in height between surfaces of the epitaxy layer and the polysilicon layer substantially within 2500 Å.

In an embodiment, the source layer is formed by a blanket implantation procedure and has a source junction depth substantially ranged from 0.2 to 1 μm.

In an embodiment, the step (d) and the step (c) have the same area.

In an embodiment, the dielectric layer is a borophosphosilicate glass (BPSG) layer, and the step (e) further comprises a step (e1) of planarizing the dielectric layer.

In an embodiment, the contact region is formed by a photolithographic process, and the step (f) further comprises a step (f1) of forming a contact plus structure in the body structure through the contact region by performing an implantation procedure and exposing a surface of the contact plus structure through the contact region.

In an embodiment, the contact structure layer in the step (g) is a wolfram-plug formed by a chemical vapor disposition and the conductive metal layer in the step (h) is an AlSiCu metal layer.

In accordance with another aspect of the present invention, the method for fabricating a TMOSFET includes steps of: (a) providing a substrate and etching the substrate to form a trench structure; (b) forming an oxide layer on the surface of the substrate and the inner sidewalls of the trench structure and depositing a polysilicon layer to fill the trench structure; (c) introducing a nitrogen gas and performing an implantation procedure and a drive-in procedure to form a body structure and a source layer in the substrate, wherein the source layer is disposed between the body structure and the oxide layer; (d) forming a dielectric layer on the trench structure and the source layer; (e) etching the dielectric layer and the source layer downwardly to the surface of the body structure to define a source structure and form a contact region; and (f) forming a conductive metal layer on the contact region and the dielectric layer to form the trench metal-oxide-semiconductor field effect transistor.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3A:
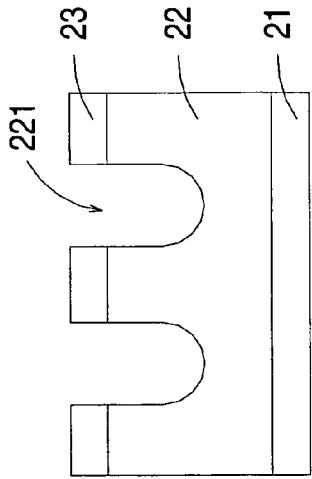
FIG. 3(a)-(n) are schematic diagrams showing the process for fabricating the TMOSFET according to the preferred embodiment of the present invention.
Figure 3B:
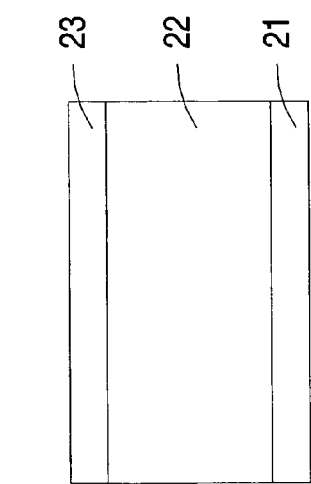
Figure 3C:
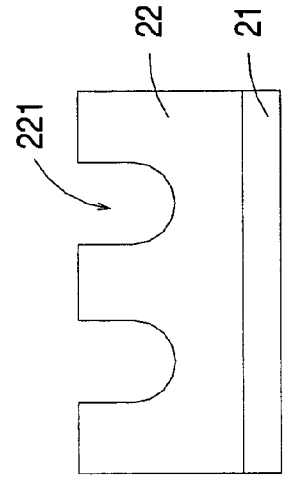
Figure 3D:
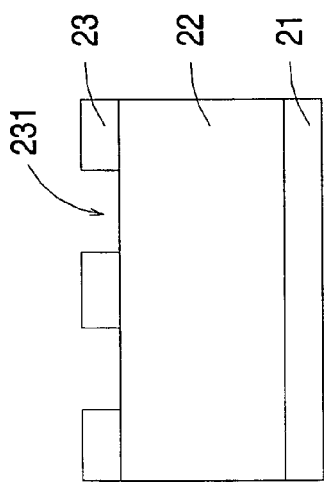
Figure 3E:
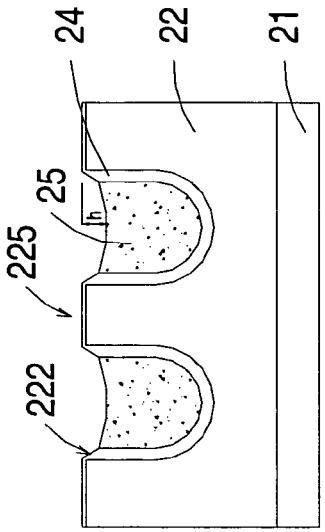
Figure 3G:
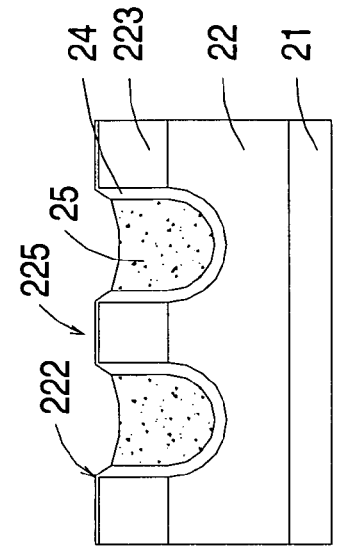
Figure 3F:
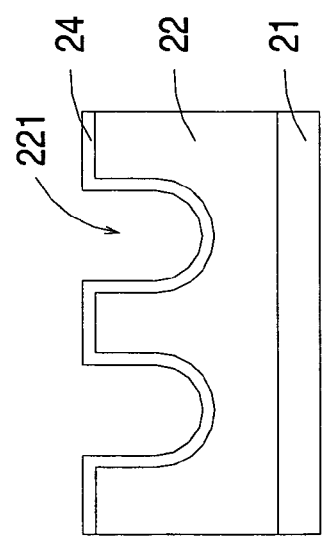
Figure 3H:
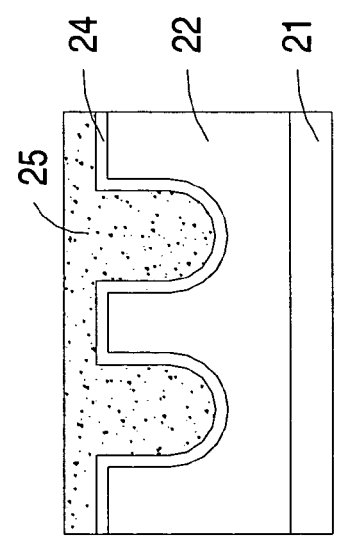
Figure 3I:
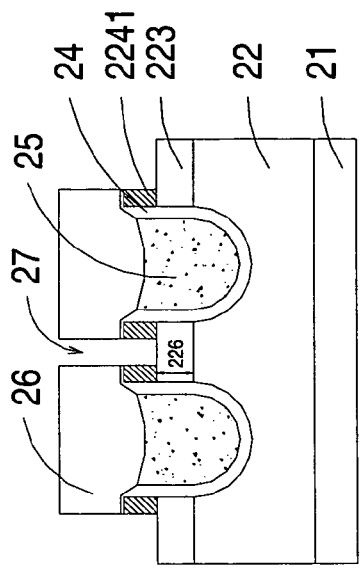
Figure 3K:
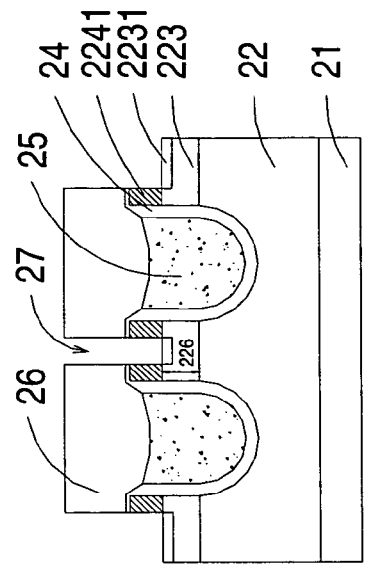
Figure 3J:
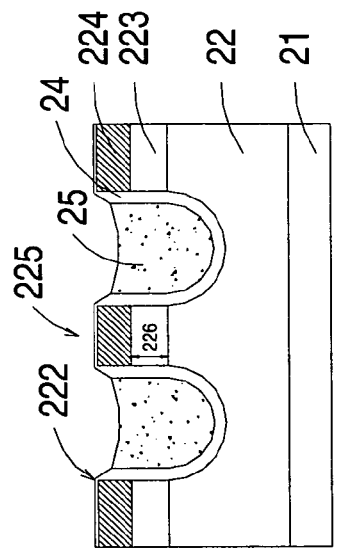
Figure 3L:
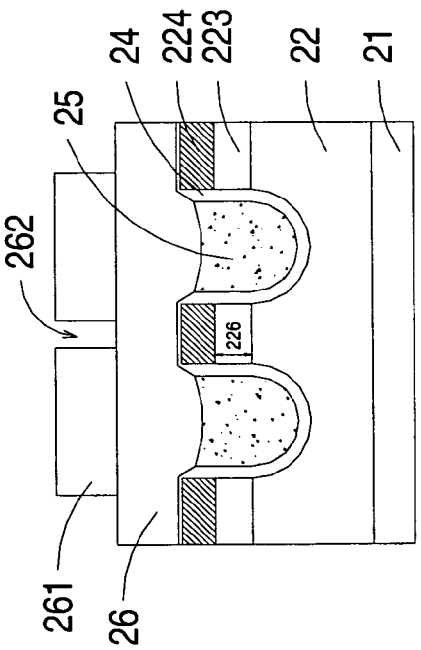
Figure 3M:
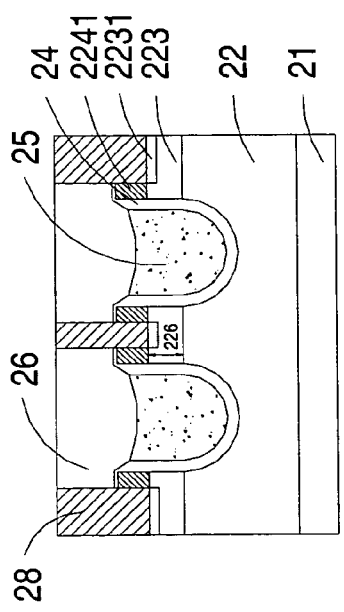
Figure 3N:
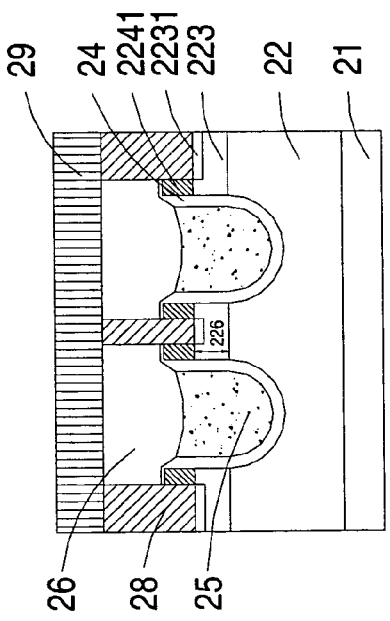

Please refer to FIGS. 3(a)-(n), which are schematic diagrams showing the process for fabricating the TMOSFET according to the preferred embodiment of the present invention. Firstly, the substrate 21 is provided and an epitaxy layer 22 is formed thereon via a horizontal, a vertical, or a cylinder epitaxy reactor. In this embodiment, the substrate 21 is preferably a silicon substrate, and the epitaxy layer 22 can be a silicon epitaxy layer with dopant, such as a negative charged (N-type) epitaxy layer or a positive charged (P-type) epitaxy layer. Certainly, the concentration of the dopant can be varied according to the requirement of the device. Afterward, the mask oxide layer 23 is formed on the epitaxy layer 22 by a chemical vapor deposition (CVD) process. In this embodiment, the mask oxide layer 23 is preferably a tetra ethyl ortho silicate (TEOS) oxide layer with a thickness ranged from 0.3 to 1 μm formed by the TEOS-CVD process (as shown in FIG. 3(a)), but not limited thereto.

The mask oxide layer 23 is etched by a photolithographic process and an etching procedure to define a trench opening 231, so as to expose the surface of the epitaxy layer 22 for forming the trench structure 221, as shown in FIG. 3(b). The mask oxide layer 23 is used as a mask for etching the epitaxy layer 22 downwardly by an isotropic etching to form a trench structure 221, as shown in FIG. 3(c). The mask oxide layer 23 on the surface of the epitaxy layer 22 is removed after the trench structure 221 is formed, as shown in FIG. 3(d).

The gate oxide layer 24 is formed on the surface of the epitaxy layer 22 and the inner sidewalls of the trench structure 221 by a thermal oxidation procedure, as shown in FIG. 3(e). Because the operation efficiency of the TMOSFET is affected by the thickness of the gate oxide layer 24, the thickness of the gate oxide layer 24 is adjusted according to the requirement. After the gate oxide layer 24 is formed, the polysilicon layer 25 is deposited to fill the trench structure 221, as shown in FIG. 3(f).

The excess polysilicon layer 25 and partial of the gate oxide layer 24 on the epitaxy layer 22 are removed by etching to control the thickness of the gate oxide layer 24 to be substantially 200±100 Å and make the polysilicon layer 25 be substantially filled in the trench structure 221. In this embodiment, the polysilicon recess depth h defined by the difference in height between the surfaces of the polysilicon layer 25 filled in the trench structure 221 and the epitaxy layer 22 is controlled within 2500 Å, as shown in FIG. 3(g). Hence the exposed silicon at the trench top corner 222 of the epitaxy layer 22 can be reduced.

Subsequently, performing a body-implantation procedure to partial of the epitaxy layer 22 and then introducing the nitrogen gas to perform a body drive-in procedure to the implanted epitaxy layer 22 for forming a body structure 223 in the epitaxy layer 22, as shown in FIG. 3(h). Because the polysilicon recess depth h in FIG. 3(g) is controlled in a decided range of 2500 Å, the exposed silicon at the trench top corner 222 of the epitaxy layer 22 is reduced. Besides, the nitrogen gas is substituted for the oxygen gas while performing the body drive-in procedure, and since the nitrogen gas will not react with the silicon under a high temperature, the silicon oxide will not be formed on the surface of the body structure 223. Comparing to the conventional fabricating method, the change of the trench top corner profile of the epitaxy layer caused by the silicon oxide formed on the surface of the body structure can be avoided in the present invention. Moreover, the step of removing the silicon oxide can be omitted in the TMOSFET fabricating procedure of the present invention.

After the body implantation/drive-in procedure is performed, the blanket implantation procedure is executed to implant and drive in a source layer 224, such that the body implantation and the source implantation have the same implantation area, as shown in FIG. 3(i). Of course, the source implantation procedure of the present invention can also be performed via a mask (not shown), and the drive-in procedure is performed after the mask is removed, so as to form the source layer 224. In this embodiment, the source layer 224 is formed between the body structure 223 and the gate oxide layer 24, and the source junction depth is substantially ranged from 0.2 to 1 μm, but not limited thereto.

Afterward, the dielectric layer 26 is deposited and planerized on the above structure, and then a photoresist 261 is deposited on the dielectric layer 26 to define a contact opening 262 via a photolithographic process as shown in FIG. 3(j), wherein the dielectric layer 26 is preferably a borophosphosilicate glass (BPSG) layer, but not limited thereto. Then an extra contact silicon etch is executed downwardly through the dielectric layer 26 to the source layer 224 till the surface of the body structure 223, so as to define a source structure 2241 and a contact region 27. Then the photoresist 261 is removed as shown in FIG. 3(k).

As shown in FIG. 3(l), the contact plus structure 2231 is implanted in the body structure 223 via the contact region 27, wherein the surface of the contact plus structure 2231 is exposed through the contact region 27. Next, a contact structure layer 28 is deposited by a CVD process for well filling the contact region 27, and the excess contact structure layer 28 is removed by an etch back process to make the surfaces of the contact structure layer 28 and the dielectric layer 26 as a flat, as shown in FIG. 3(m), wherein the contact structure layer 28 is preferably a wolfram-plug. Finally, the AlSiCu conductive metal layer 29 is deposited on the contact structure layer 28 and the dielectric layer 26, and then the TMOSFET is formed after defining the layouts (not shown) on the conductive metal layer 29 by the photolithographic process and etching process, as shown in FIG. 3(n).

Figure 1A:
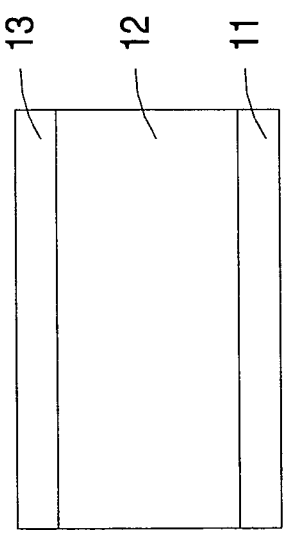
FIGS. 1(a)-(g) are schematic diagrams showing the conventional process for fabricating the TMOSFET.
Figure 1B:
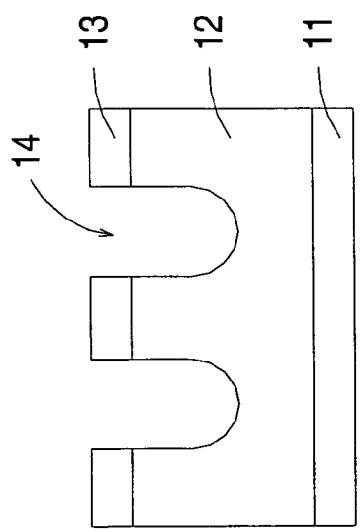
Figure 1C:
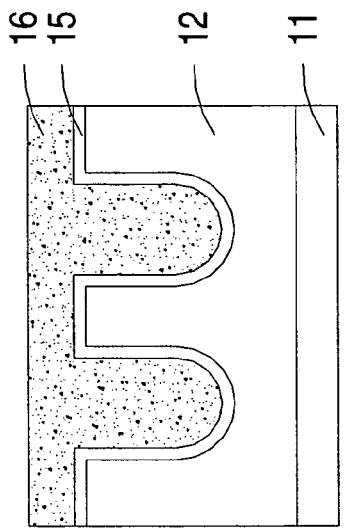
Figure 1D:
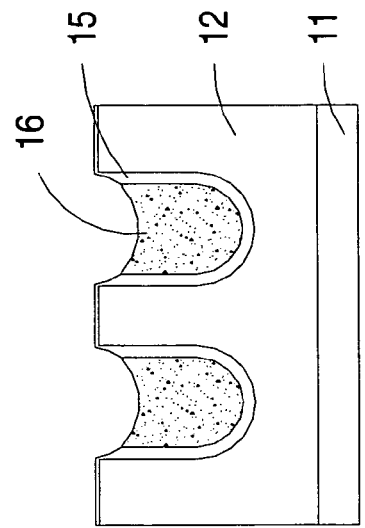
Figure 1G:
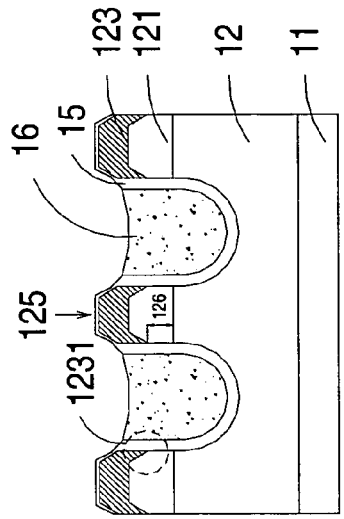
Figure 1E:
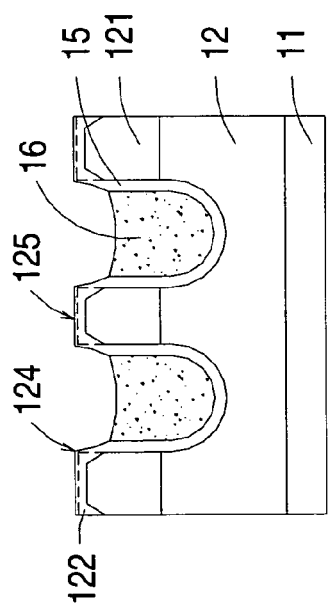
Figure 1F:
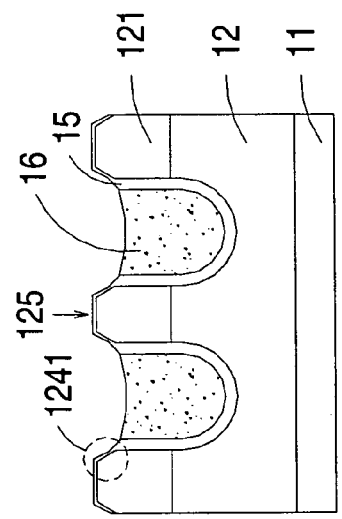

According to the foregoing description, the polysilicon recess depth h between the surfaces of the epitaxy layer 22 and the polysilicon layer 25 is controlled in the present as shown in FIG. 3(g); therefore the exposed silicon at the trench top corner 222 of the epitaxy layer 22 can be reduced. Furthermore, the nitrogen gas is used to replace the oxygen gas in the body drive-in procedure; therefore the formation of the silicon oxide on the surface of the body structure 223 can be avoided owing to the non-reaction between the silicon and the nitrogen gas. Meantime, the step of removing the silicon oxide by etching back can be omitted, and the apparent change of the profile of the Si MESA 225 can also be avoided. Thus the slanting sharp corner as shown in FIG. 1(f) will not be formed, and the profile of the trench top corner 222 will not be changed in the present invention. Since the trench top corner profile is maintained, the flat source profile with an anticipated depth can be formed in the following source drive-in procedure, so as to prevent the channel 226 from being too short. Meanwhile, the standards of the voltage threshold and the Idss can be satisfied and the punching through of the TMOSFET can also be avoided by the fabrication method of the present invention.

Moreover, in this embodiment, the TMOSFET fabricated by the method of the present invention is tested by the Wafer Accept Test (WAT) and shows 95% of yield, 1.3V of voltage threshold (Vt), and 5 nA of Idss. Comparing to the TMOSFET fabricated by the conventional method, the present invention provides the TMOSFET with a higher yield, a higher voltage threshold, and a lower Idss, which conforms the standards of the voltage and the Idss.

Figure 2:
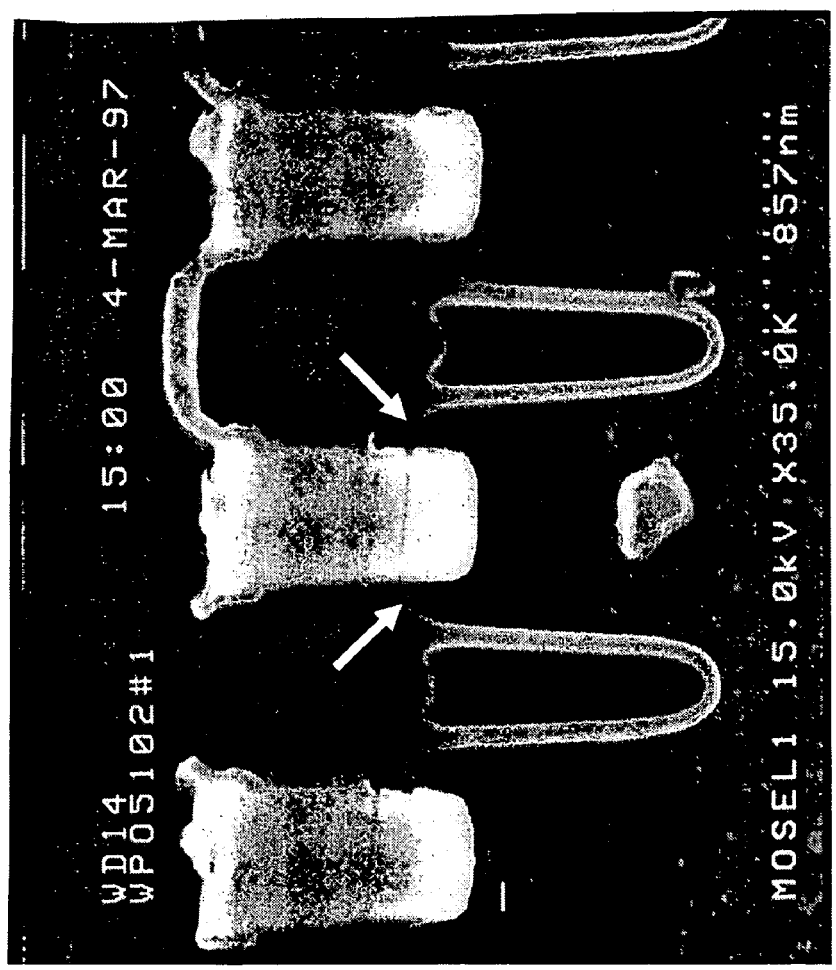
FIG. 2 is a scanning electron microscope (SEM) image of the TMOSFET fabricated by the conventional process.
Figure 4:
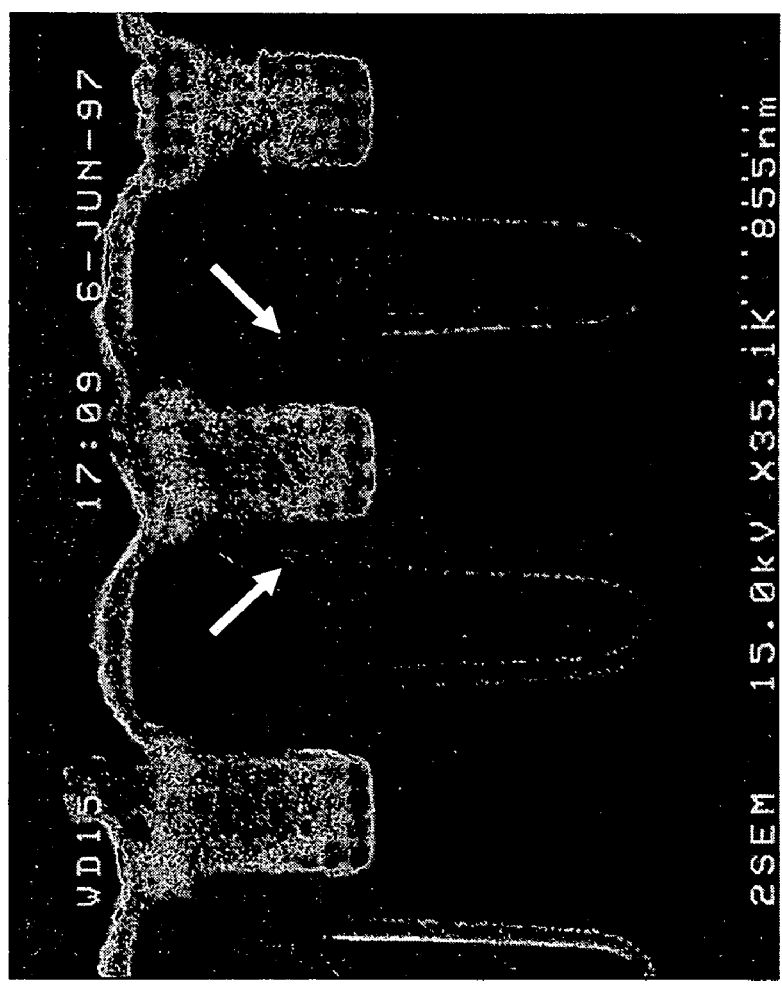
FIG. 4 is a scanning electron microscope (SEM) image of the TMOSFET fabricated by the preferred embodiment of the present invention.

Please refer to FIG. 4, which is a scanning electron microscope (SEM) image of the TMOSFET fabricated by the preferred embodiment of the present invention. As shown in FIG. 4, no redundant silicon oxide is formed on the surface of the body structure 223 because the oxygen gas is replaced by the nitrogen gas in the body drive-in procedure. Hence the profile of the trench top corner 222 of the TMOSFET fabricated by the method of the present invention is not changed (pointed by the arrow) while comparing with FIG. 2, and the source junction depth can be controlled in the source drive-in procedure to render a flat source profile. It is to be understood that in the present invention, the change of the profile of the trench top corner 222 in the body drive-in procedure can be prevented, and the affections to the following source drive-in procedure caused thereby can also be avoided.

Certainly, in another embodiment of the present invention, the mask oxide layer 23 can be formed on the substrate 21 directly. The substrate 21 is preferably a silicon substrate with dopant therein, so as to form an N-type substrate or a P-type substrate. The follow-up steps are the similar to the foregoing process shown in FIGS. 3(b)-(n), wherein the epitaxy layer 22 is replaced by the substrate 21; hence it is not redundantly described here.

To sum up, in the TMOSFET fabrication method of the present invention, the oxygen gas used in the conventional fabrication method to drive-in the body structure is replaced by the nitrogen gas; hence no redundant silicon oxide will be formed on the surface of the body structure, and the change of the trench top corner profile can be avoided. Meanwhile, the etching back process for removing the silicon oxide can also be omitted. Since the profiles of the trench top corner and the Si MESA will not be changed in the body drive-in procedure, the source profile and the source junction depth can also be maintained in the following source drive-in procedure. Therefore the formation of the slanting sharp corner of the source junction can be avoided, so as to prevent the channel of the body structure from being too short. Of course, the standards of the voltage threshold and the Idss can be satisfied, and the punching through of the TMOSFET can also be averted. Furthermore, since the polysilicon recess depth h defined by the surfaces of the polysilicon layer and the epitaxy layer is controlled in the present invention, the over exposing of the silicon and the problems caused thereby can also be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a trench metal-oxide-semiconductor field effect transistor, comprising steps of:
   (a) providing a substrate, forming an epitaxy layer on said substrate and etching said epitaxy layer to form a trench structure;
   (b) forming a gate oxide layer on a surface of said epitaxy layer and inner sidewalls of said trench structure and depositing a polysilicon layer to fill said trench structure;
   (c) introducing a nitrogen gas and performing a driving-in procedure to form a body structure in said epitaxy layer;
   (d) performing an implantation procedure to form a source layer between said body structure and said gate oxide layer;
   (e) forming a dielectric layer on said trench structure and said source layer;
   (f) etching said dielectric layer and said source layer downwardly to a surface of said body structure to define a source structure and form a contact region;
   (g) filling said contact region with a contact structure layer; and
   (h) forming a conductive metal layer on said contact structure layer and said dielectric layer to form said trench metal-oxide-semiconductor field effect transistor.

2. The method for fabricating a trench metal-oxide-semiconductor field effect transistor according to claim 1 wherein said epitaxy layer is an N-typed epitaxy layer or a P-typed epitaxy layer.

3. The method for fabricating a trench metal-oxide-semiconductor field effect transistor according to claim 1 wherein said step (a) further comprises steps of:
   (a1) forming a mask oxide layer on said epitaxy layer;
   (a2) defining a trench opening to expose said surface of said epitaxy layer for forming said trench structure; and
   (a3) etching said epitaxy layer to form said trench structure and removing said mask oxide layer.

4. The method for fabricating a trench metal-oxide-semiconductor field effect transistor according to claim 3 wherein said mask oxide layer in said step (a1) is a tetra ethyl ortho silicate (TEOS) layer with a thickness substantially ranged from 0.3 to 1 μm and formed by a tetra ethyl ortho silicate chemical vapor disposition (TEOS-CVD) process, and said trench opening in said step (a2) is defined by a photolithographic process.

5. The method for fabricating a trench metal-oxide-semiconductor field effect transistor according to claim 1 wherein said gate oxide layer is formed by a thermal oxidation procedure, and said step (b) further comprises a step (b1) of removing partial of said gate oxide layer and said polysilicon layer from said surface of said epitaxy layer and controlling a difference in height between surfaces of said epitaxy layer and said polysilicon layer substantially within 2500 Å.

6. The method for fabricating a trench metal-oxide-semiconductor field effect transistor according to claim 1 wherein said source layer is formed by a blanket implantation procedure and has a source junction depth substantially ranged from 0.2 to 1 μm.

7. The method for fabricating a trench metal-oxide-semiconductor field effect transistor according to claim 1 wherein said step (d) and said step (c) have the same area.

8. The method for fabricating a trench metal-oxide-semiconductor field effect transistor according to claim 1 wherein said dielectric layer is a borophosphosilicate glass (BPSG) layer, and said step (e) further comprises a step (e1) of planarizing said dielectric layer.

9. The method for fabricating a trench metal-oxide-semiconductor field effect transistor according to claim 1 wherein said contact region is formed by a photolithographic process, and said step (f) further comprises a step (f1) of forming a contact plus structure in said body structure through said contact region by performing an implantation procedure and exposing a surface of said contact plus structure through said contact region.

10. The method for fabricating a trench metal-oxide-semiconductor field effect transistor according to claim 1 wherein said contact structure layer in said step (g) is a wolfram-plug formed by a chemical vapor disposition and said conductive metal layer in said step (h) is an AlSiCu metal layer.

11. A method for fabricating a trench metal-oxide-semiconductor field effect transistor, comprising steps of:
   (a) providing a substrate and etching said substrate to form a trench structure;
   (b) forming an oxide layer on a surface of said substrate and inner sidewalls of said trench structure and depositing a polysilicon layer to fill said trench structure;
   (c) introducing a nitrogen gas and performing an implantation procedure and a drive-in procedure to form a body structure and a source layer in said substrate, wherein said source layer is disposed between said body structure and said oxide layer;
   (d) forming a dielectric layer on said trench structure and said source layer;
   (e) etching said dielectric layer and said source layer downwardly to a surface of said body structure to define a source structure and form a contact region; and
   (f) forming a conductive metal layer on said contact region and said dielectric layer to form said trench metal-oxide-semiconductor field effect transistor.

12. The method for fabricating a trench metal-oxide-semiconductor field effect transistor according to claim 11 wherein said substrate is an N-type substrate or a P-type substrate.

13. The method for fabricating a trench metal-oxide-semiconductor field effect transistor according to claim 11 wherein said step (a) further comprises steps of:
   (a1) forming a mask oxide layer on said substrate;
   (a2) defining a trench opening to expose said surface of said substrate for forming said trench structure; and
   (a3) etching said substrate to form said trench structure and removing said mask oxide layer.

14. The method for fabricating a trench metal-oxide-semiconductor field effect transistor according to claim 13 wherein said mask oxide layer in said step (a1) is a tetra ethyl ortho silicate (TEOS) layer with a thickness substantially ranged from 0.3 to 1 μm and formed by a tetra ethyl ortho silicate chemical vapor disposition (TEOS-CVD) process, and said trench opening in said step (a2) is defined by a photolithographic process.

15. The method for fabricating a trench metal-oxide-semiconductor field effect transistor according to claim 11 wherein said oxide layer is formed by a thermal oxidation procedure, and said step (b) further comprises a step (b1) of removing partial of said oxide layer and said polysilicon layer from said surface of said substrate and controlling a difference in height between surfaces of said substrate and said polysilicon layer substantially within 2500 Å.

16. The method for fabricating a trench metal-oxide-semiconductor field effect transistor according to claim 11 wherein said body structure and said source layer are formed by a blanket implantation procedure, and said source layer has a source junction depth substantially ranged from 0.2 to 1 μm.

17. The method for fabricating a trench metal-oxide-semiconductor field effect transistor according to claim 11 wherein said dielectric layer is a borophosphosilicate glass (BPSG) layer, and said step (d) further comprises a step (d1) of planarizing said dielectric layer.

18. The method for fabricating a trench metal-oxide-semiconductor field effect transistor according to claim 11 wherein said contact region is formed by a photplithographic process, and said step (e) further comprises steps of:

(e1) forming a contact plus structure in said body structure through said contact region by performing an implantation procedure and exposing a surface of said contact plus structure through said contact region; and (e2) filling said contact region with a contact structure layer.

19. The method for fabricating a trench metal-oxide-semiconductor field effect transistor according to claim 18 wherein said contact structure layer in said step (e2) is a wolfram-plus formed by a chemical vapor disposition (CVD).

20. The method for fabricating a trench metal-oxide-semiconductor field effect transistor according to claim 11 wherein said conductive metal layer in said step (f) is an AlSiCu metal layer.

* * * * *